United States Patent
Wei et al.

(10) Patent No.: US 6,803,798 B1
(45) Date of Patent: Oct. 12, 2004

(54) OUTPUT CONTROL APPARATUS OF PULSE WIDTH MODULATOR

(75) Inventors: Wei-Hsin Wei, Chupei (TW); Sheng-Yi Ho, Chupei (TW); Jung-Lin Chang, Chupei (TW)

(73) Assignee: Sonix Technology Co., Hsinchu (TW)

( * ) Notice: Subject to any disclaimer, the term of this patent is extended or adjusted under 35 U.S.C. 154(b) by 0 days.

(21) Appl. No.: 10/639,503

(22) Filed: Aug. 13, 2003

(30) Foreign Application Priority Data

Mar. 19, 2003 (TW) .................................... 092106074 A

(51) Int. Cl.[7] .............................. H03K 5/02; H03K 7/02
(52) U.S. Cl. ...................... 327/178; 327/333; 330/10; 381/120
(58) Field of Search ................................ 327/178, 179, 327/180, 333, 312, 316, 323; 330/10, 135, 136; 381/120, 121, 107, 108

(56) References Cited

U.S. PATENT DOCUMENTS

| | | | | |
|---|---|---|---|---|
| 5,382,915 A | * | 1/1995 | Muri et al. | 330/10 |
| 5,430,335 A | * | 7/1995 | Tanoi | 327/170 |
| 5,898,340 A | * | 4/1999 | Chatterjee et al. | 330/251 |
| 6,388,477 B1 | * | 5/2002 | Juang | 327/112 |
| 6,492,868 B2 | * | 12/2002 | Kirn | 330/10 |

* cited by examiner

Primary Examiner—Tuan T. Lam
(74) Attorney, Agent, or Firm—Troxell Law Office PLLC

(57) ABSTRACT

The invention provides an output control apparatus for adjusting the output level of a pulse width modulation (PWM) signal by changing the amplitude level of the output PWM signal. The output control apparatus comprises a control signal generator, a digital-to-analog converter (DAC), and an output circuit. The control signal generator generates a digital control signal. The DAC outputs a predetermined level according to the digital control signal. The output circuit with a negative feedback loop receives the PWM signal and receives the predetermined level by the negative feedback loop. While the PWM signal is logic number "0", the negative feedback loop is not switched on, so as to control the level of the PWM signal at a base level. While the PWM signal is logic number "1", the negative feedback loop is switched on, so as to control the level of the PWM signal at the predetermined level.

20 Claims, 9 Drawing Sheets

OUTPUT CONTROL APPARATUS OF PULSE WIDTH MODULATOR

BACKGROUND OF THE INVENTION

1. Field of the Invention

The present invention is an output control apparatus of a pulse width modulator; it is especially an output control apparatus that can adjust the output amplitude of a pulse width modulation signal (PWM signal).

2. Description of the Prior Art

The method of audio output of the pulse width modulation (PWM) has been applied to consumer products extensively, especially in portable electronic products. For portable electronic products that use batteries as the power source, the power consumption is one of the most concerned considerations. The biggest advantage of the output method of the PWM is its high power and efficiency.

Please refer to FIG. 1. FIG. 1 is a schematic diagram of an audio output apparatus 10 of the PWM according to the prior art. The audio output apparatus 10 of the PWM according to the prior art comprises a digital volume controller 12, a pulse code modulation to pulse width modulation converter (PCM-to-PWM converter) 14, a PWM output circuit 20, and an speaker 16. To complete an audio output with the PWM technology of the prior art, if adjustment of volume is necessary, it would be done as shown in FIG. 1. The audio data of the audio source is processed by pulse code modulation first; then, the PCM data is transferred to the digital volume controller 12. The user then inputs a volume control signal to make the digital volume controller 12 adjusts the value of the PCM data.

As shown in FIG. 1, the PCM data processed by the digital volume controller 12 is transferred to the PCM-to-PWM converter 14 for converting the PCM data to the PWM signal. Then, via the PWM output circuit 20 triggering the speaker 16, the signal is being sent out as audio sound. Because the PWM output circuit 20 according to the prior art can only output at a fixed level, the value of the PCM data needs to be adjusted to change the duty of the PWM signal output.

Please refer to FIG. 2. FIG. 2 is a schematic diagram of the output circuit 20 and the speaker 16 shown in FIG. 1. The output circuit 20 of the PWM according to the prior art comprises two inverters 22, 24, and four power transistors M0, M1, M2, M3.

As shown in FIG. 2, PI and NI represent the input signals that are differential PWM signal. Through the combination circuit that comprises the power transistors M0~M3, the output level of the input signal is being controlled at a fixed value. PO and NO represent the output, and the output circuit 20 drives the speaker 16 according to the input signal and the fixed level. The power transistors M0~M3 can be taken as the switches of the circuit. While the input signal is logic number "0", the power transistors M0 /or M2 are not switched on, but the power transistors M1 /or M3 are switched on. Therefore, the output signal level of the output PO /or NO is close to the low level VSS. While the input signal is logic number "1", the power transistors M1 /or M3 are not switched on, but the power transistors M0 /or M2 are switched on; the output signal level of the outputs PO /or NO is then close to the high level VDD.

The inverters 22, 24 are used for changing the polarity of the input signals PI and NI to make PI/NI and PO/NO in the same phase. PO and NO are the pulse signals with 0~100% duty, and the converting frequency of the pulse signals may be 10~100 kilohertz. For the coil within the speaker 16, the equivalent impedance in the converting frequency is very high while the current in the frequency within the coil is very low, so the power consumption is also lower.

Please refer to FIG. 3. FIG. 3 is a schematic diagram of the signal of adjusting the output volume of the output apparatus 10 shown in FIG. 1. Two sets of signal group 32, 34 are shown in FIG. 3. The PWM output signal of the prior art is shown as group 32, and the PWM output signal of the prior art which the volume is reduced by ½ is shown as group 34. In FIG. 3, the signals output by PO and NO are described by the differential way, wherein Ts is the signal cycle time, and Td is the duty of each pulse of the output signals. As shown in FIG. 3, in the prior art, the input volume is reduced by reducing the duty of the original PWM output signal, without changing the output level of the signal.

However, the noise of the mixed signal of the PWM output signal becomes bigger with the output level yet doesn't become smaller with the duty. Therefore, the method of reducing volume of the prior art will show the noise of the background, making the audio quality become worse. In view of this, the present invention proposes a new framework to adjust the volume by adjusting the output pulse level to avoid the problem of worse audio quality at lower volume and to achieve the objective of improving the audio quality.

SUMMARY OF THE INVENTION

An objective of the present invention is to provide an output control apparatus of a pulse width modulator for adjusting the output level of the PWM output signal, thus to avoid the problem of the audio quality getting worse with lower volume, and to achieve the objective of improving the audio quality.

The present invention provides an output control apparatus for controlling the output level of a PWM signal at a predetermined level. The output control apparatus comprises an input, a predetermined level input, a base level input, a high level input, a level output, a switch combination, and an amplifier. The input is used for inputting the PWM signal. The predetermined level input is used for providing a predetermined level. The base level input is used for providing a base level. The high level input is used for providing the highest level. The level output is used for outputting an output level of the PWM signal. The switch combination comprises a plurality of switches for connecting to the input, the base level input, and the high level input. The amplifier combination comprises an inverting input for inputting the predetermined level, a non-inverting input for connecting to the output, and an amplifier output for connecting to the switch combination.

While the PWM signal received by the output control apparatus according to the present invention is logic number "0", the switch combination switches on the base level input and connects the amplifier output of each amplifier within the amplifier combination to the high level input, making the amplifier combination not being switched on, so as to control the level of the PWM signal at the base level.

While the PWM signal received by the output control apparatus is logic number "1", the switch combination doesn't switch on the base level input and connects the amplifier output of each amplifier to the level output to make the amplifier combination and the switch combination form a negative feedback loop, so as to control the level of the PWM signal at the predetermined level.

A control signal generator and a DAC generate the predetermined level input by the predetermined level input of the present invention. The control signal generator, according to the user control, generates various digital control signals and transfers the signals to the DAC. The DAC converts the digital control signals to a corresponding predetermined level and inputs the predetermined level to the output control apparatus via the predetermined level input.

Therefore, the present invention achieves the objective of adjusting the output amplitude of the PWM signal by controlling the predetermined level and improves the problem that the prior art has, which is to reduce the output volume only by improving the duty of the PWM signal but enlarging the mixed signals.

The advantage and spirit of the present invention may be understood by the following recitations together with the appended drawings.

BRIEF DESCRIPTION OF THE APPENDED DRAWINGS

DETAILED DESCRIPTION OF THE INVENTION

Figure 1:
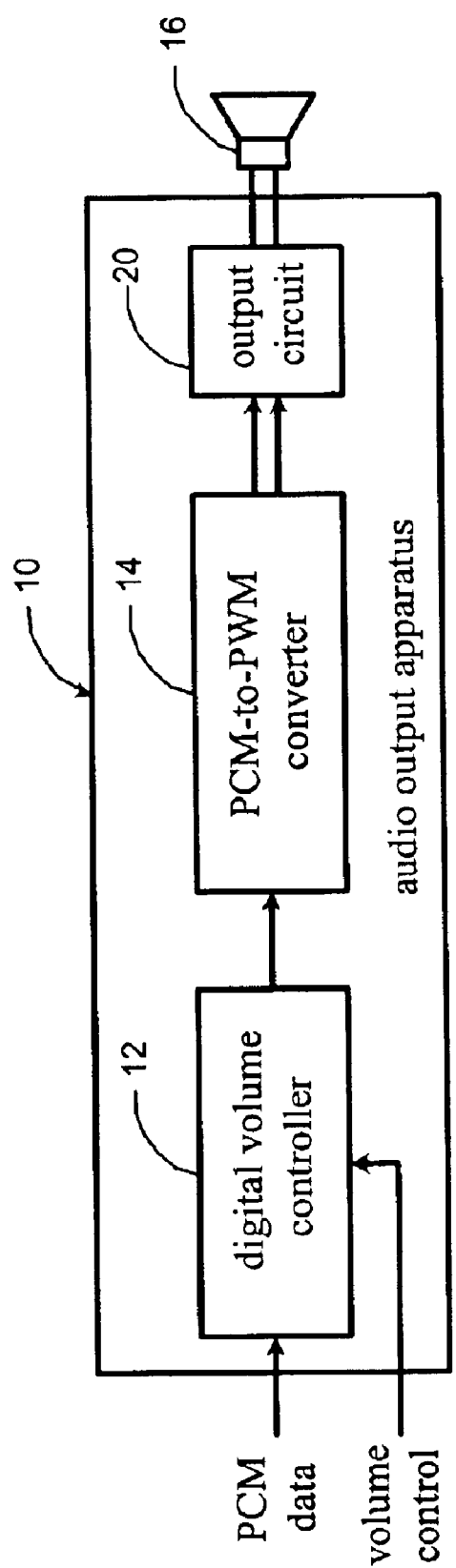
FIG. 1 is a schematic diagram of an audio output apparatus of the PWM according to the prior art.
Figure 2:
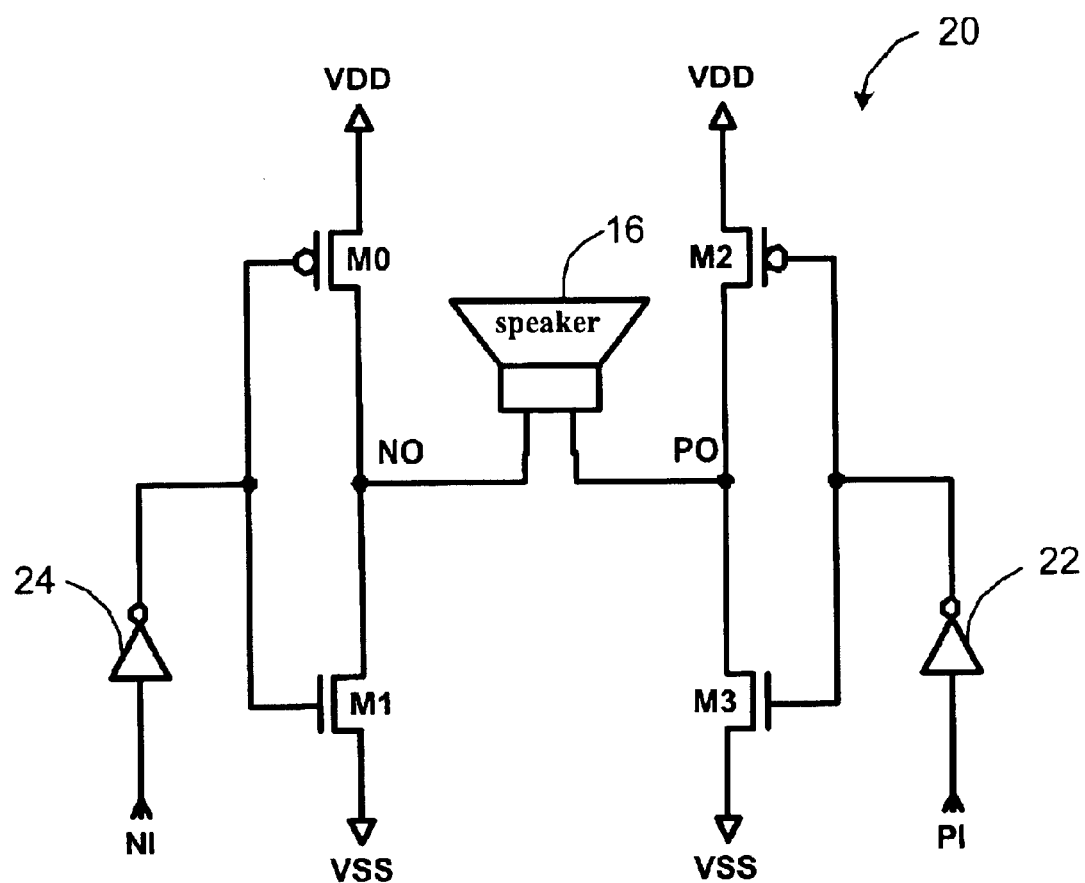
FIG. 2 is a schematic diagram of the output circuit and the speaker shown in FIG. 1.
Figure 3:
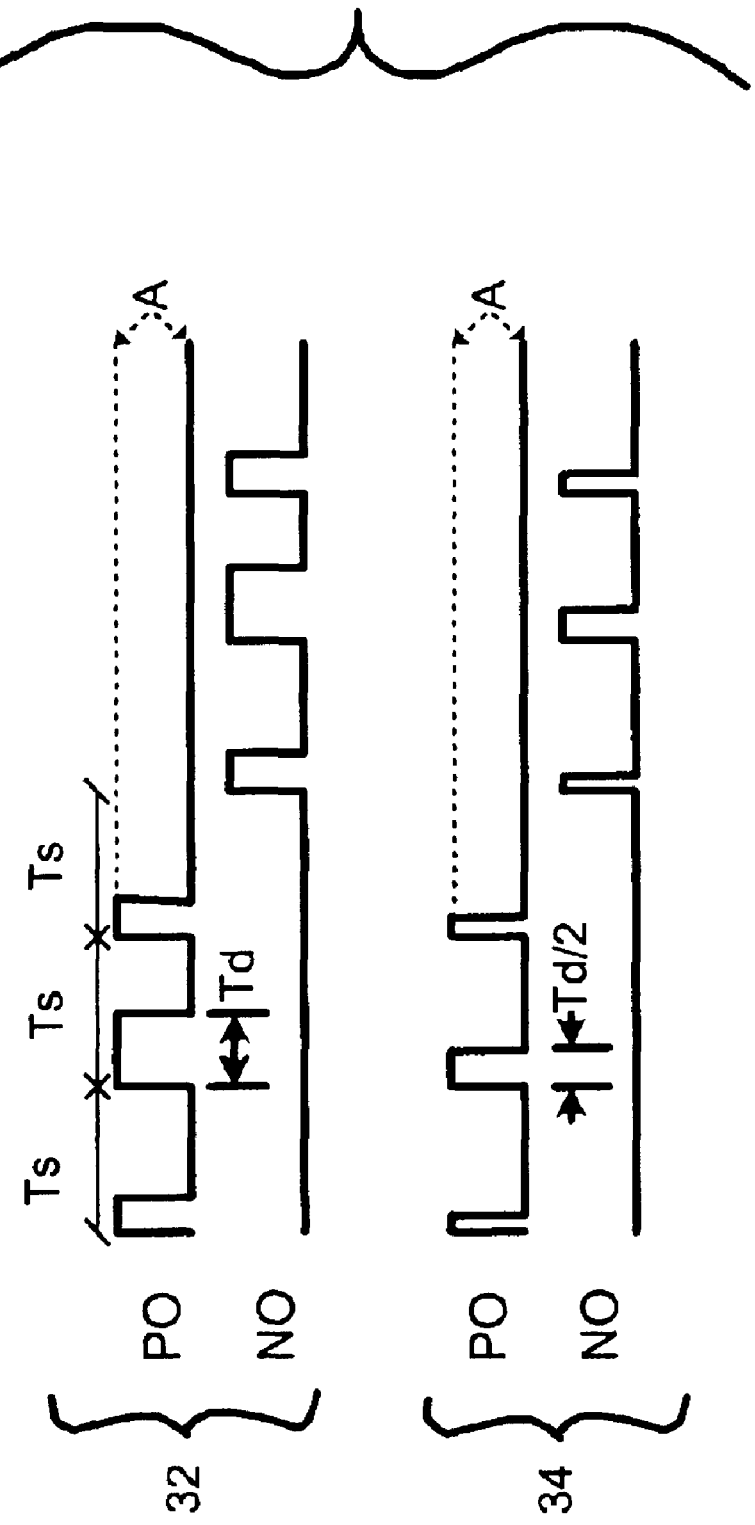
FIG. 3 is a schematic diagram of the signal of adjusting the output volume of the output apparatus shown in FIG. 1.
Figure 4:
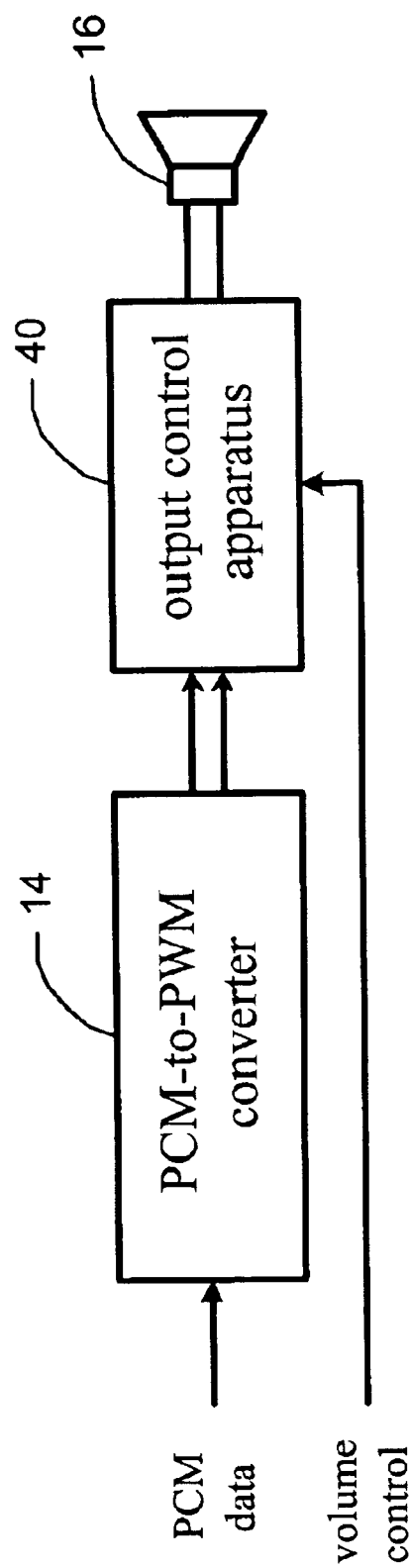
FIG. 4 is a schematic diagram of an output control apparatus and its application according to the present invention.

Please refer to FIG. 4. FIG. 4 is a schematic diagram of an output control apparatus 40 and its application according to the present invention. The output control apparatus 40 of the present invention in FIG. 4 is used for controlling the output volume. Before outputting the audio signal, the pulse code modulation data (PCM data) that represents the audio signal should be processed by the PCM-to-PWM converter 14 first to convert the PCM data to the PWM signal. After that, the output control apparatus 40 receives the PWM signal and external volume control. Then, via the output control apparatus 40, the output level of the PWM signal changes according to the volume control. Because the output level to push the speaker 16 changes according to the volume control, the volume output by the speaker 16 is controlled. One thing should be noticed here, the output control apparatus 40 of the present invention doesn't achieve the objective of changing the volume by changing the duty of the PWM signal. Therefore, the present invention doesn't suffer the problem of the prior art.

Figure 5:
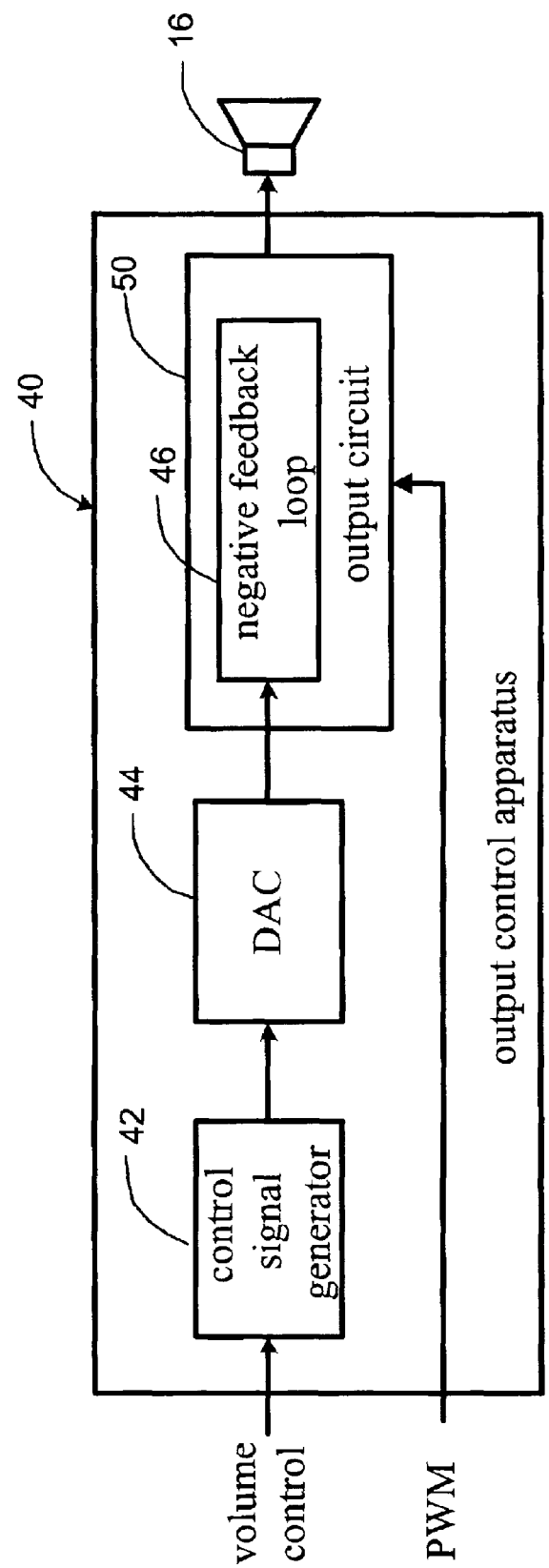
FIG. 5 is a function block diagram of the output control apparatus shown in FIG. 4.

Please refer to FIG. 5. FIG. 5 is a function block diagram of the output control apparatus 40 shown in FIG. 4. The output control apparatus 40 of the present invention is used for controlling the level of a PWM signal generated by a pulse width modulator, wherein the output control apparatus 40 comprises a control signal generator 42, a DAC 44, and an output circuit 50. The output control apparatus 40 makes the output circuit 50 receive a PWM signal and the control signal generator 42 receive the volume control corresponding to the PWM signal at the same time.

Figure 6:
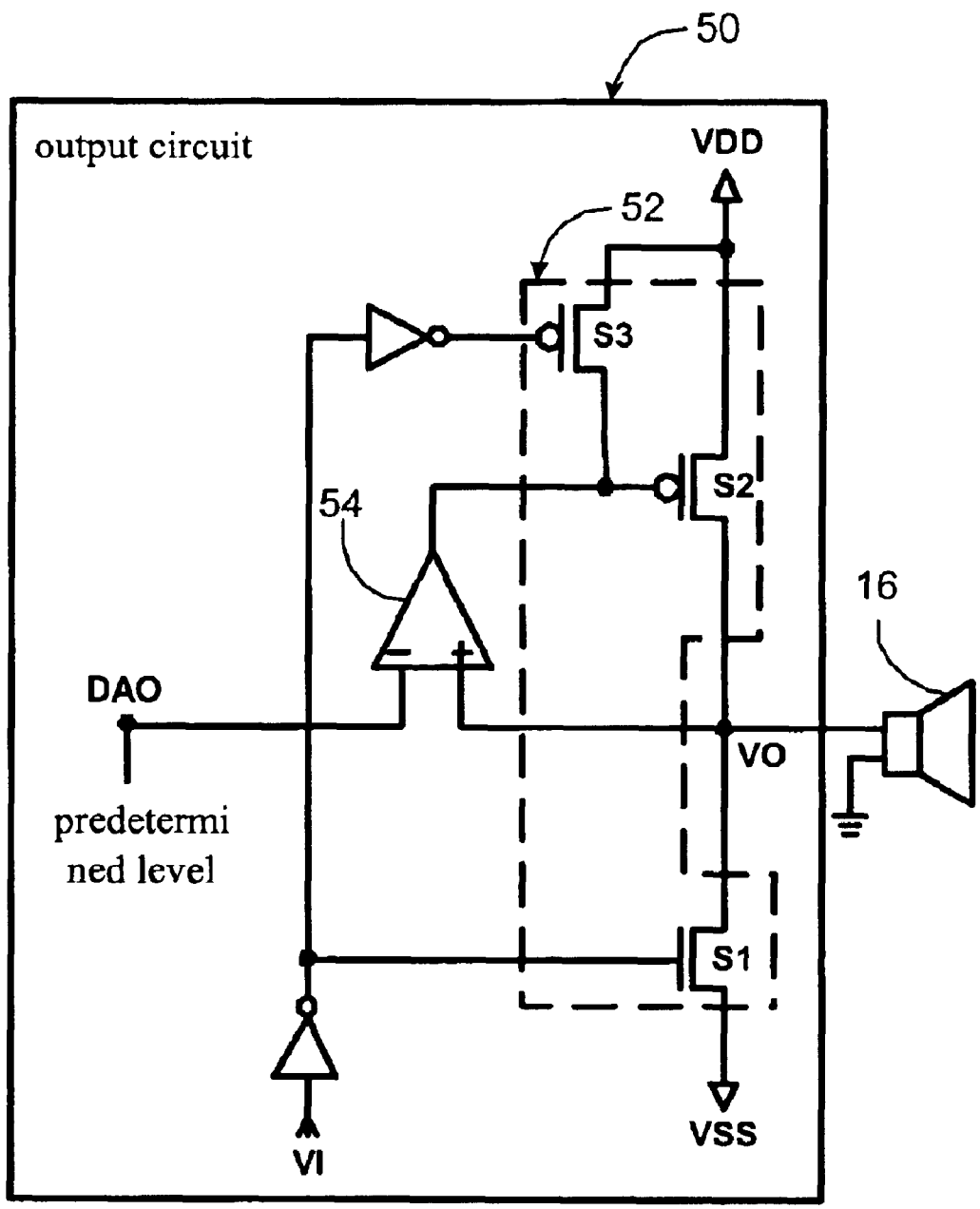
FIG. 6 is a schematic diagram of an output circuit of an embodiment according to the present invention.

Please refer to FIG. 6. FIG. 6 is a schematic diagram of an output circuit 50 of an embodiment according to the present invention. The output circuit 50 comprises an input VI, a predetermined level input DAO, a base level input VSS, a high level input VDD, a level output VO, a switch combination 52, and an amplifier 54. The input VI is used for inputting the PWM signal. The predetermined level input DAO is used for providing a predetermined level. The base level input VSS is used for providing a base level. The high level input VDD is used for providing the highest level. The level output VO is used for outputting an output level of the PWM signal.

The switch combination 52 comprises a plurality of switches. The embodiment in FIG. 6 takes the power transistor as the switch and forms the switch combination 52 with three switches S1, S2, S3. As shown in FIG. 6, the switch S1 is used for connecting to the output VO, the base level input VSS, and the input VI; the switch S2 is used for connecting to the amplifier output, the high level input VDD, and the output VO; the switch S3 is used for connecting to the high level input VDD, the input VI, and the amplifier output. The present invention controls the circuits between each element being opened or closed by cooperating with the three switches S1, S2 and S3. Wherein, the speaker 16 in FIG. 6 further connects to a ground, in practical application, the speaker may connect to the high level input VDD or the base level input VSS.

The amplifier 54 comprises an inverting input (−), a non-inverting input (+), and an amplifier output. The inverting input (−) is used for connecting to the predetermined level input DAO to input the predetermined level. The non-inverting input (+) is used for connecting to the output VO. The amplifier output is used for connecting to the switch S1 and S3.

The key of the present invention lies in how to control and adjust the output level of the PWM signal. As shown in FIG. 6, while the PWM signal being input into the input VI is logic number "0", the transistor switches S3 and S2 cooperate to connect the amplifier output with the high level input VDD, so that the amplifier is not switched on. The transistor switch S1 connects the output VO with the base level input VSS to make the output can be a base level, and at this condition, the result is the same as the output circuit of the pulse width modulation apparatus of the prior art.

While the PWM signal being input into the input VI is logic number "1", the transistor switch S1 is not switched on, and the output VO is connected to the amplifier output by the transistor switch S2. At this time, the amplifier 54 and the transistor switch S1 form a negative feedback loop 46 (shown in FIG. 5) to make the signal output level of the output VO be about the same as to the predetermined level of the predetermined level input DAO. Therefore, the output level of the output VO at logic number "1" may be adjusted by changing the voltage of the predetermined level input DAO.

Figure 7:
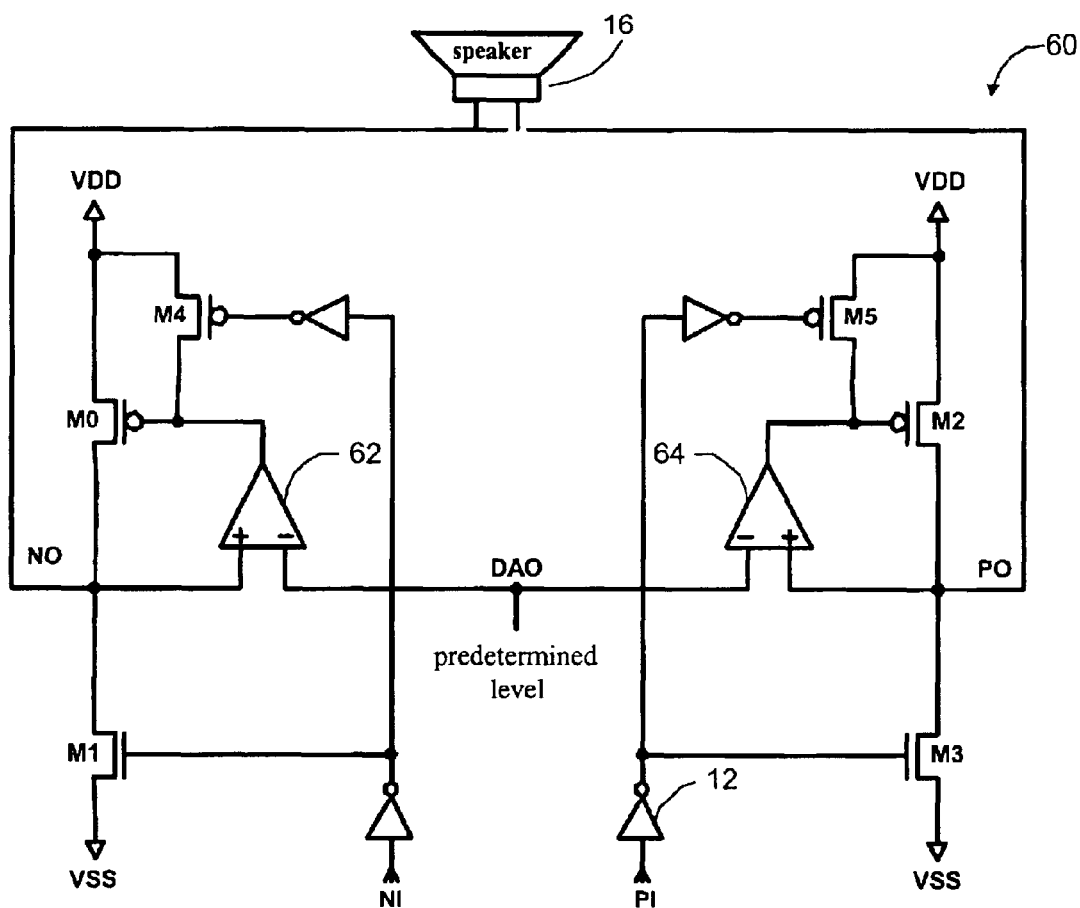
FIG. 7 is a schematic diagram of an output circuit of another embodiment according to the present invention.

Because of the PWM signal of the prior art is being input to the output circuit by the differential way, the output circuit 50 according to the present invention can also be designed to match the differential mode. Please refer to FIG. 7. FIG. 7 is a schematic diagram of an output circuit 60 of another embodiment according to the present invention. The biggest difference between FIG. 7 and FIG. 6 is that the input in FIG. 7 inputs the PWM signal by the differential way, so two sets of the designs as shown in FIG. 6 also are necessary. Due to the fact that the efficiency of the elements is almost the same, it will not be described in detail again.

As shown in FIG. 7, when the PWM signal being input to the differential input NI/PI is logic number "0", the differential output NO/PO connects to the base level input VSS by the transistor switch M1/M3. However, when the PWM signal being input to the differential input NI/PI is logic number "1", the transistor switch M0/M2 is controlled by the negative feedback loop, processed by the calculation amplifiers 62 and 64 to limit the differential output NO/PO at the value of the predetermined level input DAO. Therefore, the predetermined level of the predetermined level input DAO can be adjusted by the outside volume control to achieve the objective of adjusting the volume.

As shown in FIG. 5, the volume control represents an interface operated by a user such as a volume control turntable or a volume control key. The interface converts the volume desired by the user to a corresponding control signal. The control signal generator 42 receives the volume control and generates a digital control signal. It has to be emphasized that the interface operated by the user can be integrated into the control signal generator 42. The user can control the volume immediately via the interface of the control signal generator 42. The control signal generator 42 generates the digital control signal for controlling the volume by the user. The control signal generator 42 is an N bits structure for generating $2^N$ kinds of different digital control signals. The DAC 44 cooperates with the control signal generator 42 to output $2^N$ kinds of different predetermined levels to the predetermined level input DAO according to the digital control signal.

Figure 8:
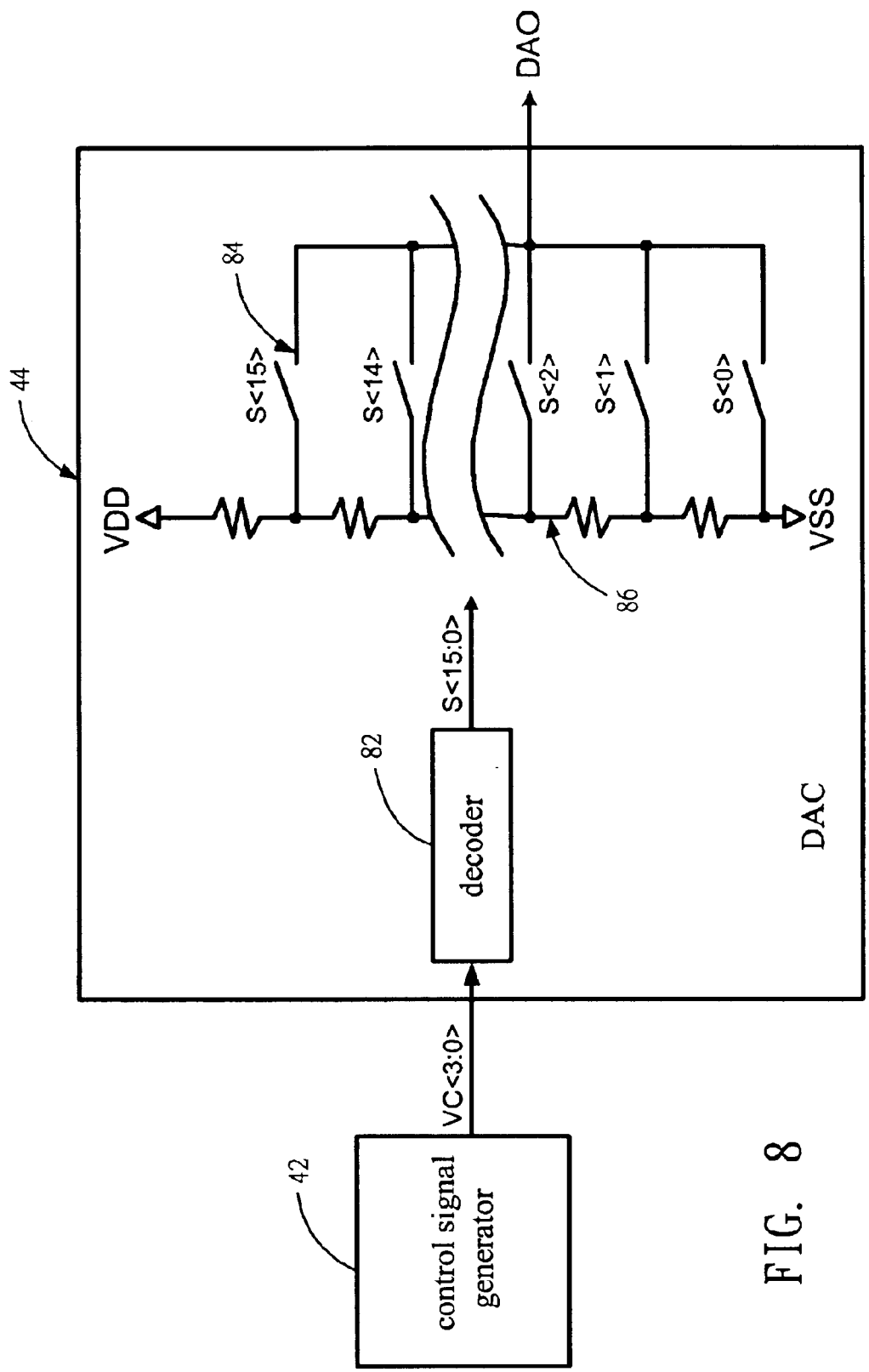
FIG. 8 is a schematic diagram of the control signal generator and the DAC of 4 bits structure according to the present invention.

Please refer to FIG. 8. FIG. 8 is a schematic diagram of the control signal generator 42 and the DAC 44 of 4 bits structure according to the present invention. If N=4, the DAC 44 shown in FIG. 8 can be obtained. The DAC 44 according to the present invention comprises a decoder 82, a plurality of analog switches 84, and a plurality of resistances 86. As shown in FIG. 8. The 4 bits digital control signal VC<3:0> generated by the control signal generator passes through a decoder 82 (4–16 digital decoder in this embodiment) to obtain 16 level control signals S<15:0>. Please refer to Table 1. Table 1 is a comparison table of the digital control signal and the level control signal. The 16 level control signals S<15:0> is used for controlling 16 analog switches 84. The output level of the predetermined level input DAO is determined by the level value of VC<3:0> and 16 resistances 86. The 16 resistance values are not necessarily equal. The necessary resistance value is calculated according to the practical volume level. For example, the volume adjusting interval in common use depends on dB value, so that the output voltage of equal dB value interval can be obtained by combining proper resistance value.

TABLE 1

| digital control signal | level control signal |
| --- | --- |
| 0000 | 0000_0000_0000_0001 |
| 0001 | 0000_0000_0000_0010 |

TABLE 1-continued

| digital control signal | level control signal |
| --- | --- |
| 0010 | 0000_0000_0000_0100 |
| 0011 | 0000_0000_0000_1000 |
| 0100 | 0000_0000_0000_0000 |
| 0101 | 0000_0000_0010_0000 |
| 0110 | 0000_0000_0100_0000 |
| 0111 | 0000_0000_1000_0000 |
| 1000 | 0000_0000_0000_0000 |
| 1001 | 0000_0010_0000_0000 |
| 1010 | 0000_0100_0000_0000 |
| 1011 | 0000_1000_0000_0000 |
| 1100 | 0001_0000_0000_0000 |
| 1101 | 0010_0000_0000_0000 |
| 1110 | 0100_0000_0000_0000 |
| 1111 | 1000_0000_0000_0000 |

Figure 9:
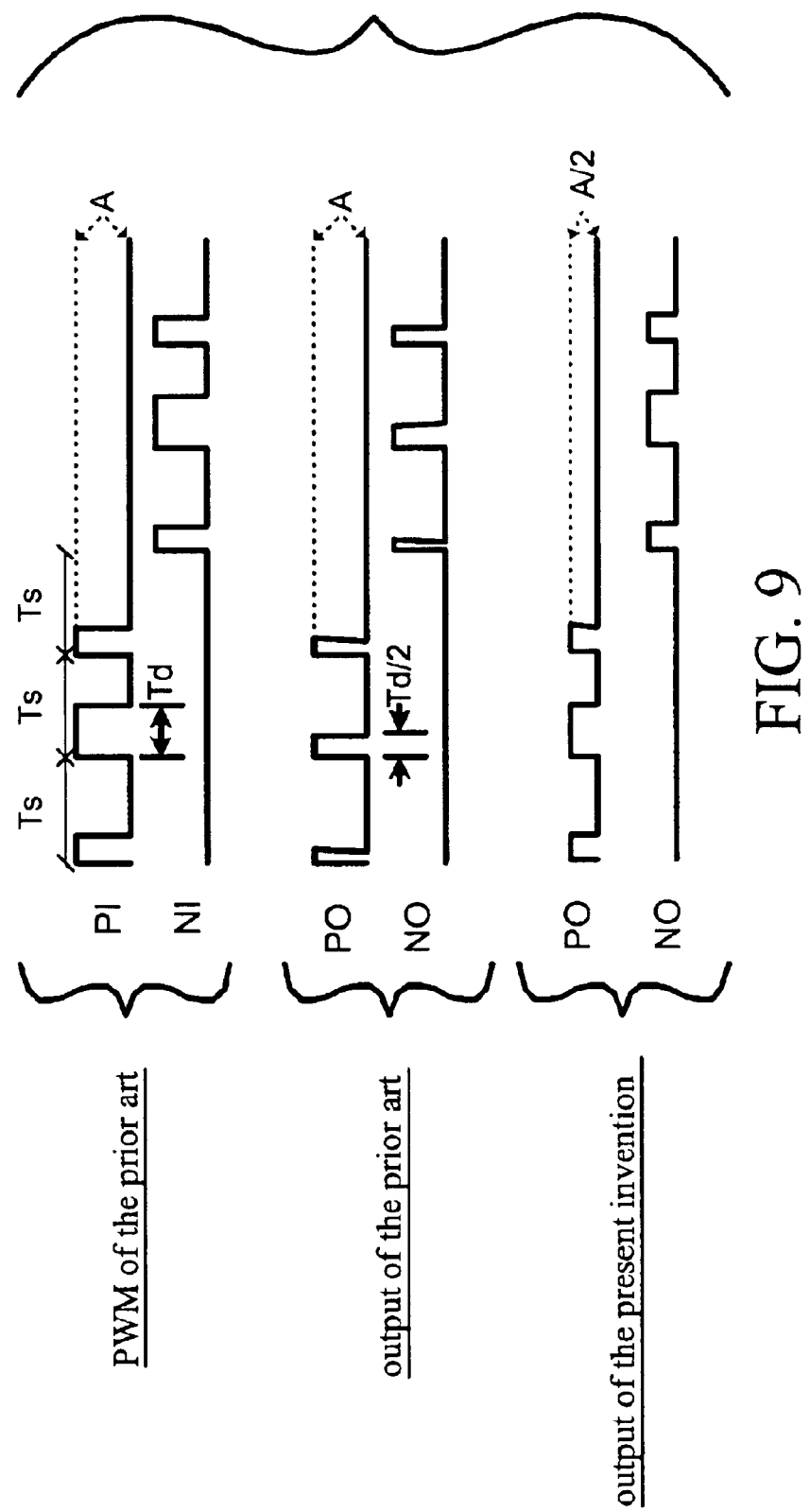
FIG. 9 is a schematic diagram of the output level of the PWM signal in comparing the prior art and the present invention.

Please refer to FIG. 9. FIG. 9 is a schematic diagram of the output level of the PWM signal in comparing the prior art and the present invention. As shown in FIG. 9, PI/IN is differential PWM according to the prior art, wherein the cycle time of the pulse is fixed at Ts, the level is fixed at A, and the pulse width changes with different signals. If the volume is to be reduced by ½, the way of the prior art is to reduce all pulse width (duty) Td by ½ immediately. Because the pulse level A doesn't change, the noise is the same as that before adjusting. Comparatively, the noise sounds are more obviously, and the audio quality is worse. The present invention adjusts the output level to ½ to reduce the noise as the volume is reduced, and hence to allow better audio quality.

As mentioned above, the present invention adjusts volume by adjusting the output level of the signal instead of by the conventional method to adjust volume by adjusting the pulse width of the PWM signal to improve the prior art. Therefore, the method of controlling the volume according to the present invention can avoid the disadvantage of enlarging the noise to signal ratio of the prior art and achieve the objective of improving the audio quality.

With the example and explanations above, the features and spirits of the invention are hopefully well described. Those skilled in the art will readily observe that numerous modifications and alterations of the device may be made while retaining the teaching of the invention. Accordingly, the above disclosure should be construed as limited only by the meters and bounds of the appended claims.

What is claimed is:

1. A control apparatus for controlling a level of a pulse width modulation signal (PWM signal) generated by a pulse width modulator (PWM), the apparatus comprising:
    a control signal generator for generating a digital control signal;
    a digital-to-analog converter (DAC) for outputting a predetermined level according to the digital control signal; and
    an output circuit with a negative feedback loop for
        receiving the PWM signal, and receiving the predetermined level by the negative feedback loop;
        while the PWM signal is logic number "0", not switching on the negative feedback loop, so as to control the level of the PWM signal at a base level; and
        while the PWM signal is logic number "1", switching on the negative feedback loop, so as to control the level of the PWM signal at the predetermined level.

2. The apparatus of claim 1, wherein the control signal generator is an N bits structure for generating $2^N$ kinds of different digital control signals.

3. The apparatus of claim 2, wherein the DAC generates $2^N$ kinds of different predetermined levels according to the $2^N$ kinds of different digital control signals.

4. The apparatus of claim 1, wherein the DAC further comprises:
   a decoder for converting the digital control signal to a corresponding level control signal;
   a plurality of analog switches, each analog switches switching on or off being controlled by the level control signal; and
   a plurality of resistances connecting to a power supply for determining the predetermined level according to the allocation of the plurality of analog switches.

5. The apparatus of claim 1, wherein the output circuit further comprises a receiving element for receiving the PWM signal and judging the PWM signal is logic number "0" or "1".

6. The apparatus of claim 1, wherein the output circuit further comprises a base level input for providing the base level.

7. The apparatus of claim 6, wherein the output circuit further comprises a plurality of switch components for
   while the PWM signal is logic number "0", not switching on the negative feedback loop but switching on the base level input to control the level of the PWM signal at the base level; and
   while the PWM signal is logic number "1", switching on the negative feedback loop to control the level of the PWM signal at the predetermined level.

8. The apparatus of claim 7, wherein the negative feedback loop further comprises an amplifier combination for receiving the predetermined level, and while the negative feedback loop is switched on, setting the level of the PWM signal equal to the predetermined level.

9. An output control apparatus for controlling an output level of a PWM signal at a predetermined level, the output control apparatus comprising:
   an input for inputting the PWM signal;
   a predetermined level input for providing a predetermined level;
   a base level input for providing a base level;
   a high level input for providing a highest level;
   a level output for outputting an output level of the PWM signal;
   a switch combination comprising a plurality of switches for connecting to the input, the base level input, and the high level input; and
   an amplifier comprising:
      an inverting input for inputting the predetermined level;
      a non-inverting input for connecting to the level output; and
      an amplifier output for connecting to the switch combination;
   wherein, while the PWM signal is logic number "0", the switch combination switches on the base level input and connects the amplifier output to the high level input to make the amplifier not be switched on, so as to control the level of the PWM signal at the base level; and
   wherein, while the PWM signal is logic number "1", the switch combination doesn't switch on the base level input and connects the amplifier output to the level output to make the amplifier and the switch combination form a negative feedback loop, so as to control the level of the PWM signal at the predetermined level.

10. The output control apparatus of claim 9, further comprising a control signal generator for generating a digital control signal.

11. The output control apparatus of claim 10, further comprising a DAC for receiving the digital control signal and outputting the predetermined level to the predetermined level input, wherein the predetermined level is determined by the digital control signal.

12. The apparatus of claim 11, wherein the control signal generator is a N bits structure for generating $2^N$ kinds of different digital control signals.

13. The apparatus of claim 11, wherein the DAC further comprises:
   a decoder for converting the digital control signal to a corresponding level control signal;
   a plurality of analog switches, each analog switches switching on or off being controlled by the level control signal; and
   a plurality of resistances connecting to a power supply for determining the predetermined level according to the allocation of the plurality of analog switches.

14. The apparatus of claim 12, wherein the DAC generates $2^N$ kinds of different predetermined levels according to the $2^N$ kinds of different digital control signals.

15. An output control apparatus for controlling an output level of a PWM signal at a predetermined level, the output control apparatus comprising:
   a set of differential inputs for differentially inputting the PWM signal;
   a predetermined level input for providing a predetermined level;
   a set of base level inputs for providing a base level;
   a set of high level inputs for providing a highest level;
   a set of differential level outputs for differentially outputting an output level of the PWM signal;
   a switch combination comprising a plurality of switches for connecting to the set of differential inputs, the set of base level inputs, and the set of high level inputs; and
   an amplifier combination comprising a plurality of amplifiers, each amplifier connecting to a differential input of the set of differential inputs, a base level input of the set of base level inputs, a high level input of the set of high level inputs, and a differential level input of the set of differential level inputs, each the amplifier comprising:
      an inverting input for inputting the predetermined level;
      a non-inverting input for connecting to the differential level output; and
      an amplifier output for connecting to the switch combination;
   wherein while the PWM signal is logic number "0", the switch combination switches on the base level input and connects the amplifier output to the high level input to make the amplifier not be switched on, so as to control the level of the PWM signal at the base level; and
   while the PWM signal is logic number "1", the switch combination doesn't switch on the base level input and connects the amplifier output to the level output to make the amplifier combination and the switch combination form a negative feedback loop, so as to control the level of the PWM signal at the predetermined level.

16. The output control apparatus of claim 15, further comprising a control signal generator for generating a digital control signal.

17. The output control apparatus of claim 16, further comprising a DAC for receiving the digital control signal and outputting the predetermined level to the predetermined level input; wherein the predetermined level is determined by the digital control signal.

18. The apparatus of claim 17, wherein the control signal generator is an N bits structure for generating $2^N$ kinds of different digital control signals.

19. The apparatus of claim 17, wherein the DAC further comprises:
   a decoder for converting the digital control signal to a corresponding level control signal;
   a plurality of analog switches, each analog switches switching on or off being controlled by the level control signal; and
   a plurality of resistances connecting to a power supply for determining the predetermined level according to the allocation of the plurality of analog switches.

20. The apparatus of claim 18, wherein the DAC generates $2^N$ kinds of different predetermined levels according to the $2^N$ kinds of different digital control signals.

* * * * *